United States Patent
Mu et al.

(10) Patent No.: US 8,099,070 B2
(45) Date of Patent: Jan. 17, 2012

(54) PASSIVE MIXER AND FOUR PHASE CLOCKING METHOD AND APPARATUS

(75) Inventors: Fenghao Mu, Hjärup (SE); Fredrik Tillman, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 853 days.

(21) Appl. No.: 12/108,239

(22) Filed: Apr. 23, 2008

(65) Prior Publication Data

US 2009/0270062 A1    Oct. 29, 2009

(51) Int. Cl.
H04B 1/16 (2006.01)

(52) U.S. Cl. ............... 455/209; 455/189.1; 455/323; 330/311

(58) Field of Classification Search .......... 455/209, 455/189.1, 205, 323; 330/289, 311, 285, 330/296
See application file for complete search history.

(56) References Cited

U.S. PATENT DOCUMENTS

| | | | |
|---|---|---|---|
| 5,974,306 A | 10/1999 | Hornak et al. | |
| 6,016,422 A | 1/2000 | Bartusiak | |
| 6,313,688 B1 | 11/2001 | Lee et al. | |
| 6,348,830 B1 | 2/2002 | Rebeiz et al. | |
| 6,510,185 B2 | 1/2003 | Lee et al. | |
| 6,847,808 B2 | 1/2005 | Zhou | |
| 6,972,610 B2 | 12/2005 | Behzad | |
| 6,999,747 B2 | 2/2006 | Su | |
| 7,031,688 B2 | 4/2006 | Malone et al. | |
| 7,085,548 B1 | 8/2006 | Kluge et al. | |
| 7,092,692 B2 | 8/2006 | Tan et al. | |
| 7,113,755 B2 | 9/2006 | Abdelli | |
| 7,145,963 B2 | 12/2006 | Magoon et al. | |
| 7,149,493 B2 | 12/2006 | Molnar et al. | |
| 7,277,682 B2 | 10/2007 | Zhou | |
| 7,286,019 B2* | 10/2007 | Peng et al. | 330/311 |
| 2004/0152437 A1 | 8/2004 | Behzad | |
| 2004/0166803 A1* | 8/2004 | Moloudi et al. | 455/20 |
| 2005/0239430 A1 | 10/2005 | Shah | |

(Continued)

FOREIGN PATENT DOCUMENTS

EP    1 542 356    6/2005

(Continued)

OTHER PUBLICATIONS

Author Unknown. "Improving Receiver Intercept Point Using Selectivity." Maxim, May 17, 2001. Internet article available at: http://pdfserv.maxim-ic.com/en/an1AN749.pdf.

(Continued)

*Primary Examiner* — Christian Hannon
(74) *Attorney, Agent, or Firm* — Coats & Bennett, P.L.L.C.

(57) ABSTRACT

According to one embodiment, a radio frequency receiver includes a quadrature mixer for converting radio frequency signals to baseband signals or intermediate frequency signals. The quadrature mixer includes an in-phase passive mixer and a quadrature-phase passive mixer. Each passive mixer includes a mixer core having a plurality of mixer input switch transistors and a plurality of output switch transistors connected to the mixer input switch transistors. Clock circuitry generates a first set of clock signals and a second set of clock signals. The first set of clock signals has a frequency twice that of the second set of clock signals. The first set of clock signals is arranged to drive the mixer input switch transistors and the second set of clock signals is arranged to drive the output switch transistors.

19 Claims, 8 Drawing Sheets

U.S. PATENT DOCUMENTS

| | | |
|---|---|---|
| 2007/0054648 A1 | 3/2007 | Pullela et al. |
| 2007/0072575 A1 | 3/2007 | Sowlati et al. |
| 2007/0082640 A1 | 4/2007 | Kim |
| 2007/0171760 A1 | 7/2007 | Gomm et al. |
| 2007/0190959 A1 | 8/2007 | Kim et al. |
| 2007/0218855 A1 | 9/2007 | Ismail et al. |
| 2007/0230558 A1 | 10/2007 | Sjoland et al. |
| 2007/0242779 A1 | 10/2007 | Choi et al. |
| 2008/0003973 A1 | 1/2008 | Vaisanen |
| 2008/0020728 A1 | 1/2008 | Zhuo et al. |
| 2008/0139149 A1 | 6/2008 | Mu et al. |
| 2008/0284487 A1 | 11/2008 | Pullela et al. |
| 2009/0270062 A1 | 10/2009 | Mu et al. |

FOREIGN PATENT DOCUMENTS

| | | |
|---|---|---|
| EP | 1 560 326 | 8/2005 |
| KR | 10-0666701 B1 | 1/2007 |
| WO | 03/071696 A1 | 8/2003 |
| WO | 2005/060089 A2 | 6/2005 |

OTHER PUBLICATIONS

Mu, F. et al. U.S. Appl. No. 12/108,252, filed Apr. 23, 2008 and entitled "Passive Mixer and Four-Phase Clocking Method and Apparatus.".

* cited by examiner

PASSIVE MIXER AND FOUR PHASE CLOCKING METHOD AND APPARATUS

TECHNICAL FIELD

The present invention generally relates to wireless communication systems, and more particularly relates to high linearity radio frequency (RF) receivers for RF communication systems.

BACKGROUND

Receiver mixers are a basic component in RF communication systems. Receiver mixers down-convert received RF signals into intermediate frequency (IF) signals or directly into zero intermediate frequency (ZIF) signals by multiplying the received signal with a local oscillator (LO) clock signal. ZIF, also known as homodyne or "direct conversion", is typically easier to implement in a receiver chip than IF conversion because ZIF eliminates pass-band filtering associated with IF conversion and reduces the space and complexity of the receiver as well as cost. A typical direct conversion receiver includes one or more LNAs (low noise amplifiers), a balun, in-phase (I) and quadrature-phase (Q) mixers and two low-pass filters.

Receiver mixers can be passive or active. An active mixer provides gain while converting an RF signal. However, active mixers cause higher distortion and have a higher noise figure. The higher noise figure arises from flicker noise which is not present in passive mixers. Flicker noise is very harmful for narrow band RF applications like GSM (Global System for Mobile communications). In addition, active mixers consume more power than their passive mixer counterparts.

RF communication systems usually implement duplex operation by way of a transceiver where the receiver and transmitter components function simultaneously. During transceiver operation, the transmitter typically sends signals at a high power level, injecting interference at the receiver. To counteract the interference, the receiver LNA and mixer typically have a very high linearity, especially for mixers where the RF signal is amplified after the LNA stage. For direct conversion receivers, mitigating transmitter-induced interference becomes even more important. Direct conversion receivers are typically designed to have good linearity. Especially the second order inter-modulation product is important. The second order inter-modulation product is often described by the second order input intercept point (IIP2).

IIP2 performance can be improved by using differential RF signals and a symmetric receiver topology to cancel nonlinearity caused by the transistors. A balun is conventionally used to perform single-ended to differential conversion. However, when differential RF signals are used and the receiver is configured in an RF current driving mode, a two-phase clock scheme is not feasible because the in-phase mixer loads the quadrature-phase mixer and vice versa, resulting in conversion gain drop and IQ leakage. One approach to solve this involves using a four-phase non-overlapping local oscillator clock scheme. A four-phase clock scheme also has higher conversion gain than 2-phase clocking schemes for capacitive mixer loads.

However, the duty cycle employed in sinusoidal four-phase clock schemes is typically narrow (e.g., less than 25%) to maintain non-overlapping sinusoidal I and Q clock input signals, making clock driver design difficult. When the receiving RF frequency increases, the clock signal duty cycle becomes narrower, making clock driver design even more difficult. Moreover, linearity for direct conversion passive mixers is related to the gate over-drive voltage applied to the mixer transistors. This in turn requires a large clock swing, especially for duplex communication systems where transmitter leakage interference is down-converted into the baseband signal. Increasing the bias voltage of the sinusoidal clock signals to achieve higher gate over-drive can cause overlapping clock signals, e.g. larger than 25% duty cycle, which adversely affects mixer functionality.

Also, conventional four-phase mixer architectures employ a clock driver chain having a relatively low tapering factor, meaning that more clock driver stages are required to drive the mixers and simultaneously maintain a desired duty cycle. Accordingly, the energy consumed in the clock driver cannot be recovered by a resonator tank circuit, resulting in higher power consumption. It is also difficult to align the edge of a positive clock signal with the edge of a negative clock signal, distorting down-converted baseband signals. Furthermore, it is difficult to keep the four-phase clock signals as non-overlapped because the duty cycle is small. The clock driver must be designed in a symmetric style to reach a high IIP2. Yet, process mismatch will always set an IIP2 limit. Transistor mismatch can be mitigated by increasing transistor size, but this increases power consumption in the clock driver.

SUMMARY

According to the methods and apparatus taught herein, a wireless transceiver comprises a radio frequency transmitter and receiver. The radio frequency receiver comprises a quadrature mixer configured to convert radio frequency signals to baseband signals or intermediate frequency signals. The quadrature mixer comprises an in-phase passive mixer and a quadrature-phase passive mixer. Each passive mixer comprises at least one mixer core having a plurality of mixer input switch transistors and a plurality of output switch transistors. The input switch transistors have a node connected to an RF input signal, and the output switch transistors have a node connected to an output of the mixer. Clock circuitry generates VCO (voltage controlled oscillator) clock signals and LO (local oscillator) clock signals for controlling mixer operation. The VCO clock signals have a frequency twice that of the LO clock signals.

The VCO clock signals drive the mixer input switch transistors while the lower-frequency LO clock signals drive the mixer output switch transistors. Because the duty cycle of the LO clock signals are wider than that of the VCO clock signals, the jitter of the LO signals does not influence mixer performance (but VCO jitter does). Thus, the LO clock signals can have a duty cycle between 25% and 50%. Enabling mixer output switching with lower-frequency LO clock signals and mixer input switching with higher-frequency VCO clock signals relaxes the pulse width constraints placed on the LO clock signals as well as the jitter performance while improving mixer linearity and reducing receiver power consumption.

In one embodiment, a radio frequency receiver includes a quadrature mixer for converting radio frequency signals to baseband signals or intermediate frequency signals. The quadrature mixer includes an in-phase passive mixer and a quadrature-phase passive mixer. Each passive mixer includes at least one mixer core having a plurality of mixer input switch transistors and a plurality of output switch transistors connected to the mixer input switch transistors. Clock circuitry generates a first set of clock signals and a second set of clock signals. The first set of clock signals has a frequency twice that of the second set of clock signals. The first set of clock signals is arranged to drive the mixer input switch transistors and the second set of clock signals is arranged to drive the output switch transistors.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
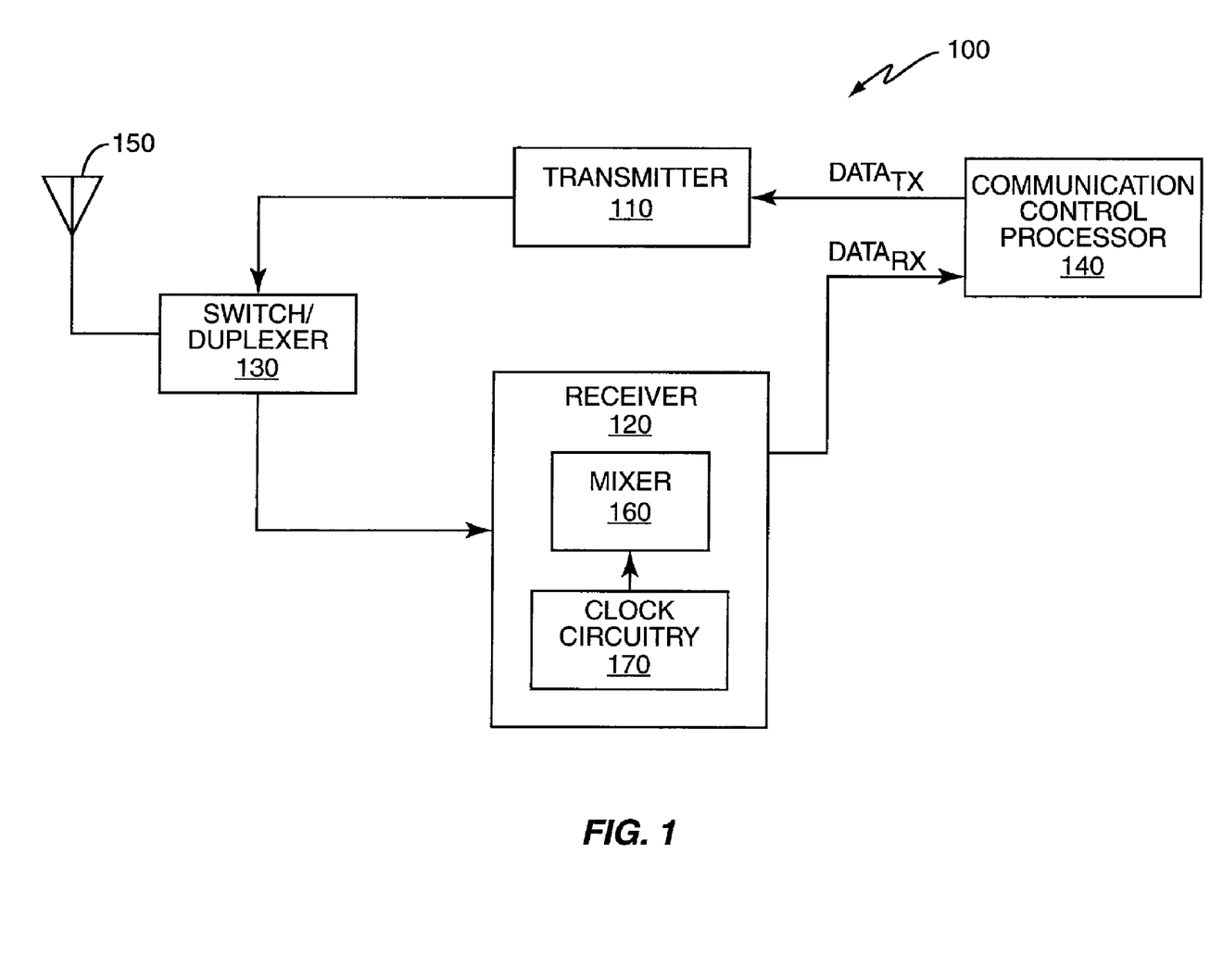
FIG. 1 is a block diagram of an embodiment of a transceiver including a quadrature mixer circuit.

FIG. 1 illustrates an embodiment of a wireless transceiver 100 including a transmitter 110 and a receiver 120. A switch/duplexer 130 enables half duplex or full duplex operation. A communication control processor 140 manages operation of the transmitter 110 and receiver 120. Baseband signals to be transmitted ($DATA_{TX}$) are passed from the processor 140 to the transmitter 110. The transmitter 110 frequency up-converts the baseband signals to RF signals. The switch/duplexer 130 couples the transmitter 110 to one or more antennas 150 so that the RF signals can be transmitted over the air. RF signals are similarly received at the one or more antennas 150 and provided to the receiver 120 via the switch/duplexer 130. The receiver 120 frequency down-converts the RF signals to baseband signals ($DATA_{RX}$) and passes the baseband signals to the control processor 140 for further processing, e.g., demodulation, decoding, etc.

In more detail, the receiver 120 includes a quadrature mixer circuit 160 (including an in-phase passive mixer and a quadrature-phase passive mixer) and clock circuitry 170. The quadrature mixer circuit 160 is driven by the clock circuitry 170 and down-converts received RF signals into baseband signals or intermediate frequency signals. The clock circuitry 170 generates LO (local oscillator) clock signals and higher-frequency VCO (voltage controlled oscillator) clock signals for controlling operation of the quadrature mixer circuit 160. The VCO clock signals have a frequency twice that of the LO clock signals.

The VCO clock signals control frequency down-conversion operation of the quadrature mixer circuit 160 when the LO clock signals are active, e.g., at a logic high level for the NMOS (n-type metal oxide semiconductor) switch transistors, or in a logic low level for the PMOS switch transistors (p-type metal oxide semiconductor), used in mixer circuit 160. The LO clock signals determine different conducting time slots of the mixer 160. That is, the LO clock signals determine when the RF input signal is coupled to the mixer outputs. The actual conducting time of the mixer circuit 160 is determined by the VCO clock signals. Thus, the LO clock signals are the gating signals which select conducting time slots to avoid leakage. Because the duty cycle of the LO clock signals is wider than that of the VCO clock signals, the jitter of the LO signals does not influence mixer performance (but VCO jitter does). The VCO and LO clock signals can be either sinusoid or pulse signals. In either case, the LO clock signals have a conducting duty cycle between 25% and 50% and the VCO clock signals have a conducting duty cycle of approximately 50% according to one embodiment. The conducting duty cycle is the conducting time divided by the corresponding clock period. A transistor is conducting when the voltage between gate and source higher/lower than the threshold voltage for NMOS/PMOS transistors, respectively. Conducting duty cycle can be tuned by adjusting bias voltage at the gates of the transistors. Broadly, enabling mixer output switching using lower-frequency LO clock signals and mixer input switching using higher-frequency VCO clock signals relaxes the pulse width constraints placed on the LO clock signals as well as the jitter performance while improving mixer linearity and reducing receiver power consumption.

Figure 2:
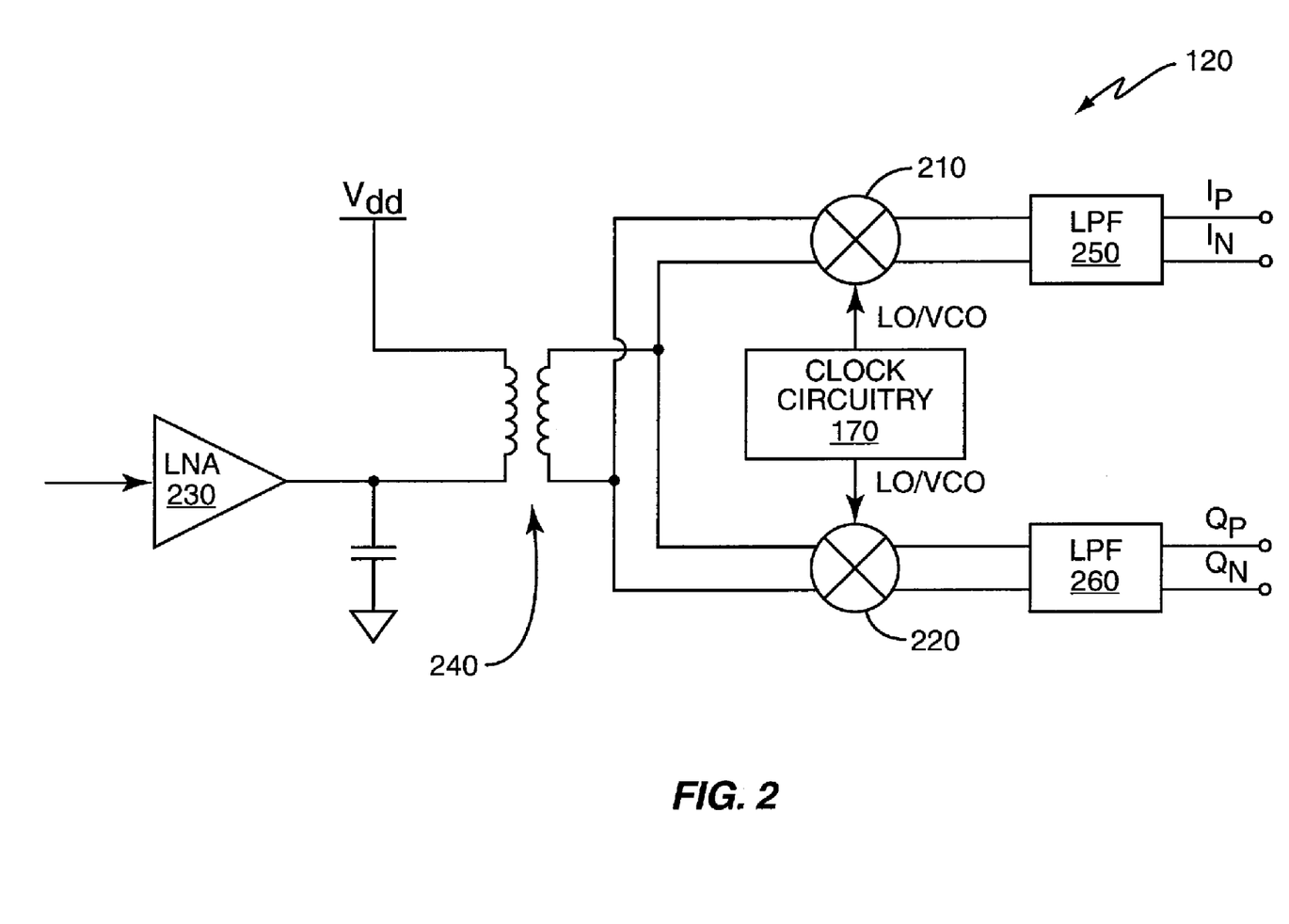
FIG. 2 is a block diagram of an embodiment of the quadrature mixer circuit of FIG. 1.

FIG. 2 illustrates an embodiment of the receiver 120. According to this embodiment, the passive quadrature mixer 160 includes an in-phase passive mixer 210 and a quadrature-phase passive mixer 220. The passive mixers 210, 220 are driven by the clock circuitry 170 and frequency down-convert received RF signals to intermediate frequency or baseband in-phase and quadrature-phase signals. Each passive mixer 210, 220 includes a mixer core which can be a complementary passive mixer or an NMOS or PMOS passive mixer.

During operation, a received RF signal is amplified by a Low Noise Amplifier (LNA) 230. The gain of LNA 230 can be varied. A balun 240 inductively couples the output of the LNA 230 to differential inputs of the in-phase and quadrature-phase passive mixers 210, 220, respectively, transforming the single-ended RF output of the LNA 230 to a differential RF signal. The balun 240 may have any ratio of primary to secondary windings. As such, the total voltage gain of the receiver 120 is the sum of the LNA and balun voltage gain. The in-phase and quadrature-phase passive mixers 210, 220 down covert the differential RF signal to low IF or baseband signals at the mixer outputs. The passive mixer outputs are then filtered by respective low pass filters 250, 260 to yield differential in-phase ($I_P/I_N$) and quadrature-phase ($Q_P/Q_N$) signals.

Figure 4:
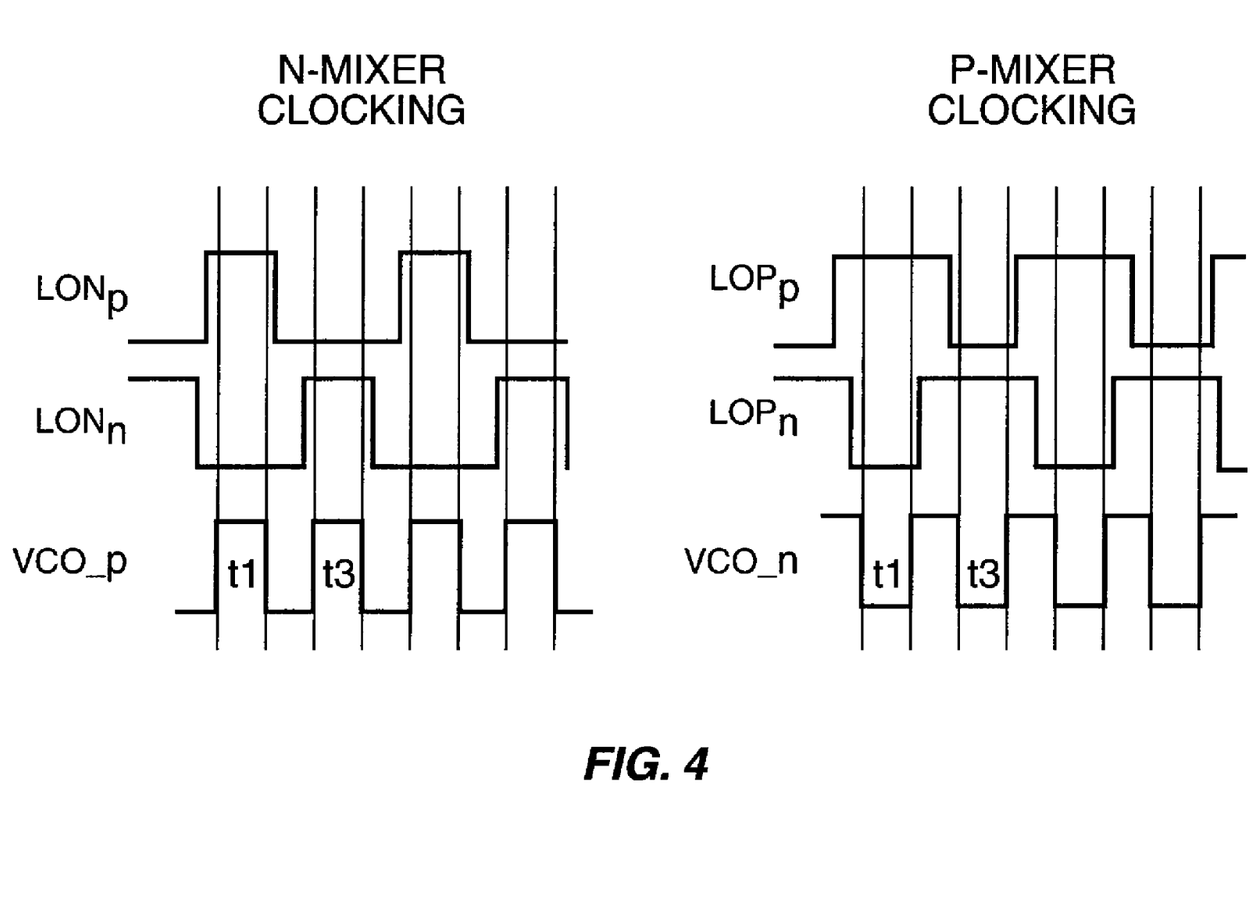
FIG. 4 is a timing diagram of a four-phase clocking scheme applied to the passive mixer cores of FIG. 3.

The clock circuitry 170 has two functions: generating the VCO and LO clock signals and driving the in-phase and quadrature-phase passive mixers 210, 220 with the clock signals. The mixers 210 and 220 are identical in topology, but driven by two different groups of the clock signals. One group of the clock signals drives the in-phase mixer 210 while the other group drives the quadrature-phase mixer 220. The LO clock signals and the VCO clock signals generated by the clock circuitry 170 form four even-spaced non-overlapping conducting time slots t1, t2, t3 and t4 for the in-phase and quadrature-phase mixers 210, 220 (time slots t1 and t3 are shown in FIG. 4 as will be described in more detail later). For example, in time slots t1 and t3, the in-phase mixer 210 conducts and samples the input RF signals. The quadrature-phase mixer 220 similarly conducts and samples the input RF signal in time slots t2 and t4. Alternatively, the quadrature-phase mixer 220 can be active during time slots t1 and t3 while the in-phase mixer 210 is active during time slots t2 and t4. For ease of explanation only, operation of only one of the two passive mixers 210, 220 and associated VCO/LO clocking scheme is discussed in more detail below.

Figure 3:
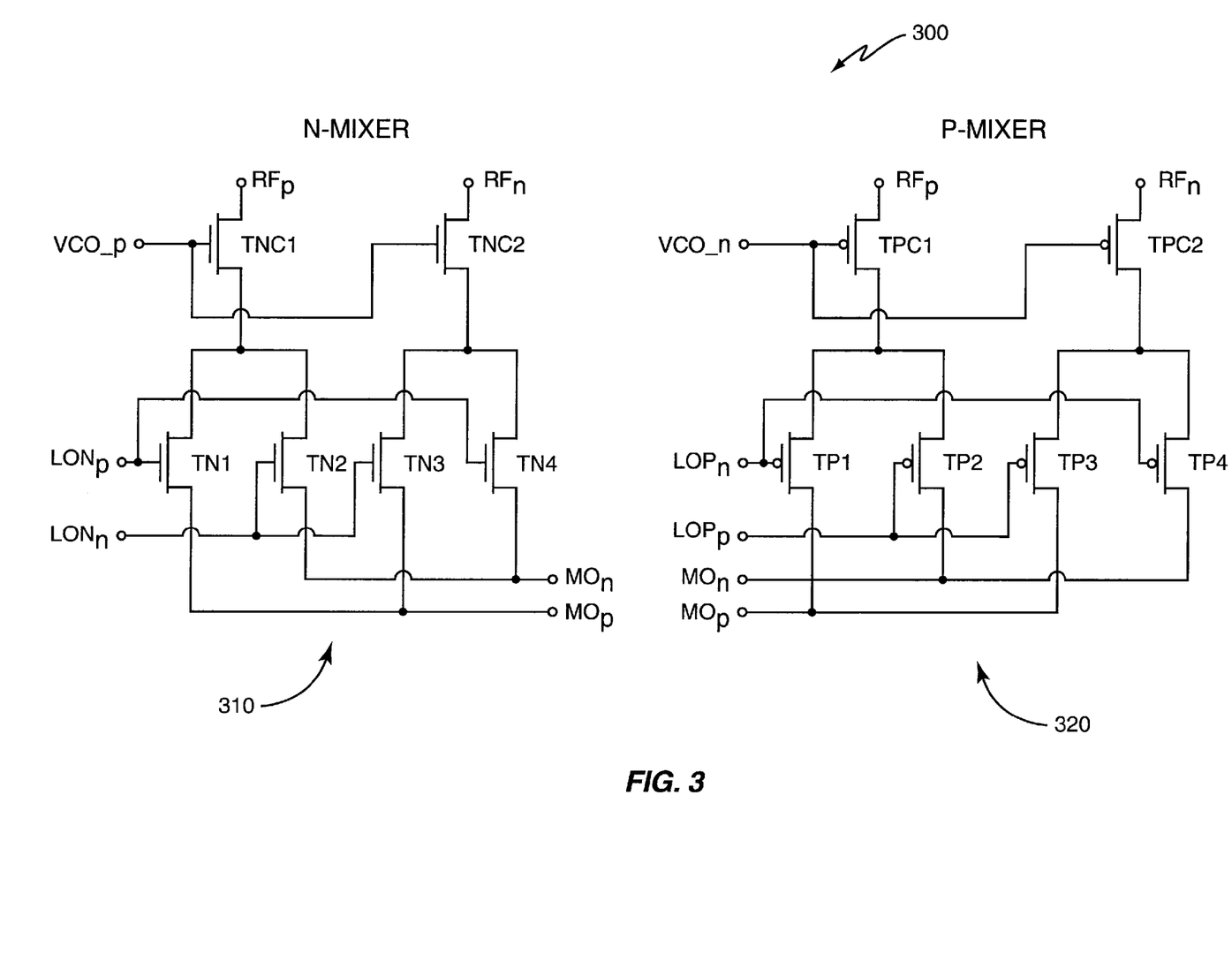
FIG. 3 is a block diagram of an embodiment of passive mixer cores included in the quadrature mixer circuit of FIG. 2.

FIG. 3 illustrates one embodiment of either the in-phase passive mixer 210 or the quadrature-phase passive mixer 220. In some embodiments, the passive mixer 210/220 is an N-mixer having only NMOS transistors. In other embodiments, the passive mixer 210/220 is a P-mixer having only PMOS transistors. In still other embodiments, the passive mixer 210/220 is a complementary passive mixer having both an N-mixer and a P-mixer. According to the embodiment shown in FIG. 3, a complimentary mixer 300 is illustrated. The complimentary mixer 300 includes a passive N-mixer core 310 having NMOS transistors and a passive P-mixer core 320 having PMOS transistors as the switch transistors. The complimentary mixer 300 converts the differential input RF signal (RFp/RFn) to either an in-phase or quadrature-phase differential IF or baseband signals at the mixer outputs (MOn/MOp). As mentioned earlier, for ease of explanation and illustration, only one channel of a quadrature mixer is shown. Those skilled in the art will recognize that the complimentary passive mixer 300 shown in FIG. 3 can be readily replicated and arranged to yield the other channel of the quadrature mixer.

With this understanding, the passive N-mixer core 310 includes four NMOS output switch transistors TN1-TN4 each having a node connected to the mixer outputs MOp/MOn and two NMOS input switch transistors TNC1-TNC2 connected to the RF input signal RFn/RFp. Each NMOS input switch transistor is coupled to two of the NMOS output switch transistors, e.g., input switch TNC1 is coupled to output switches TN1 and TN2 and input switch TNC2 is coupled to output switches TN3 and TN4. The P-mixer core 320 similarly includes four PMOS output switch transistors TP1-TP4 each having a node connected to the mixer outputs MOp/MOn and two PMOS input switch transistors TPC1-TPC2 connected to the RF input signal RFn/RFp.

The N-mixer core 310 and the P-mixer core 320 are driven with different VCO and LO clock signals according to this embodiment. In more detail, the clock circuitry 170 generates a positive VCO clock signal (VCO_p) and two LO clock signals (LONp, LONn) signals for driving the N-mixer core 310. The clock circuitry 170 generates a negative VCO clock signal (VCO_n) and two different LO clock signals (LOPp, LOPn) signals for driving the P-mixer core 320. FIG. 4 illustrates a timing diagram of the clocking scheme used to control the conducting time of the N-mixer and P-mixer cores 310, 320, respectively. In one embodiment, the N-mixer input switch transistors TNC1-TNC2 are driven by the positive VCO clock signal VCO_p and the P-mixer input switch transistors TPC1-TPC2 are driven by the negative VCO clock signal VCO_n. The N-mixer output switch transistors TN1-TN4 are driven by the LO clock signals LONp and LONn and the P-mixer output switch transistors TP1-TP4 are driven by the LO clock signals LOPp and LOPn.

When LONp and VCO_p are at a high voltage level larger than the threshold voltage of the NMOS transistors, the two N-mixer branches comprising transistors TN1/TNC1 and TN4/TNC2 conduct simultaneously about a quarter of the clock period during a first conducting time slot t1 as shown in FIG. 4. This portion of the conducting time of the clock period represents the first time slot (t1) where the input RF signals are sampled by the N-mixer core 310 and the sampling current charges/discharges the mixer capacitive load (not shown). The P-mixer core 320 similarly samples the RF input signal during the first conducting time slot t1 when LOPn and VCO_n are at a low voltage level less than the threshold voltage of the PMOS transistors referring to the source voltage. Under these conditions, the two P-mixer branches comprising transistors TP1/TPC1 and TP4/TPC2 conduct simultaneously about a quarter of the clock period during conducting time slot t1.

Thus, the RF signal RFp/RFn is sampled at time slot t1 by both passive mixer cores 310, 320. The next conducting time slot (t3) is also shown in FIG. 4. During time slot t3, the phase of the RF signal is shifted by 180°. However, the time shift between time slot t1 and t3 is half of the receiving RF signal period. Thus, the sampling polarity is the same and the sampled currents at time slots t1 and t3 are constructively added together at the differential mixer output MOp/MOn in response to the VCO/LO clocking scheme. Accordingly, the N-mixer core 310 conducts during time slot t1 when VCO_p*LONp is logic high and the P-mixer core 320 conducts when VCO_n+LOPn is logic low. Similarly, the N-mixer core 310 conducts during time slot t3 when VCO_p*LONn is logic high and the P-mixer core 320 conducts when VCO_n+LOPp is logic low. Considering the P-mixer core 320, the gates of the PMOS transistors TPC1-TPC2 and TP1-TP4 conduct at low voltage, meaning that clock signals VCO_n, LOPn and LOPp should be logic low. Thus, the P-mixer core 320 functions like negative logic that yields a logic AND operation. Combining both the N-mixer core 310 and the P-mixer core 320 yields a logic AND operation which is controlled by the VCO and LO clock signals coupled to the branches of the passive mixer cores 310, 320.

Figure 5:
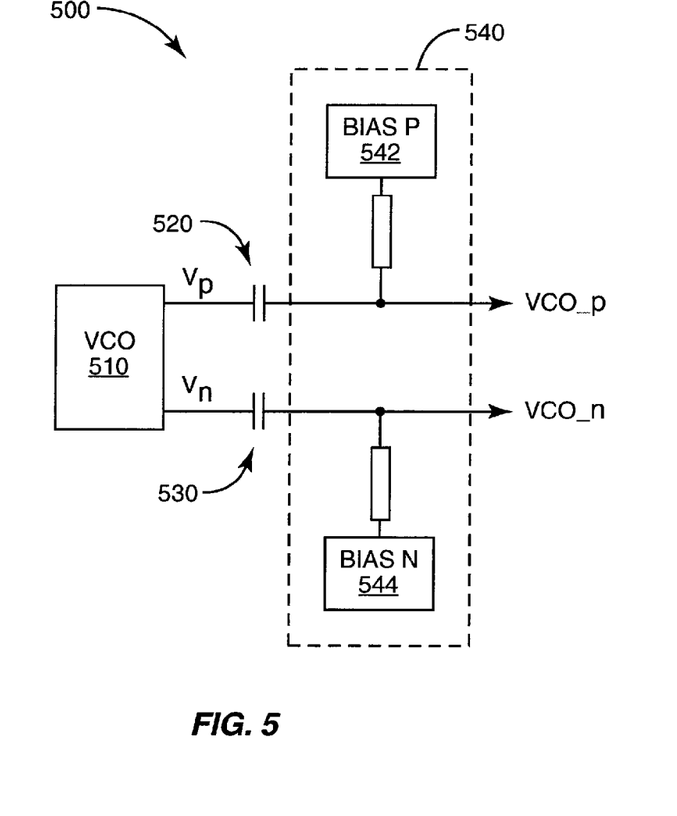
FIG. 5 is a block diagram of an embodiment of a direct AC clock coupling network.

FIG. 5 illustrates one embodiment of an AC coupling network 500 that couples the VCO clock signals to the N-mixer and P-mixer cores 310, 320. A VCO component 510 of the clock circuitry 170 generates differential VCO clock signals Vp and Vn. The differential VCO clock signals Vp and Vn are directly AC-coupled to the N-mixer and P-mixer cores 310, 320 via respective capacitors 520, 530. Coupling Vp and Vn to the N-mixer and P-mixer cores 310, 320 using the AC coupling network 500 reduces leakage between the mixer cores 310, 320.

The AC coupling network 500 may also include bias circuitry 540 for improving matching between the positive and negative VCO clock signals VCO_p and VCO_n. A bias circuit 542, 544 is coupled to respective ones of the capacitor outputs. The bias circuits 542, 544 adjust the bias levels of the respective VCO clock signals VCO_p and VCO_n, improving matching between the signals. This in turn advantageously adjusts the conducting time slots (t1 and t3) of the N-mixer and P-mixer cores 310, 320. In one embodiment, the bias circuits 542, 544 are digital-to-analog converters (DAC) that output a bias voltage applied to respective ones of the VCO clock signals VCO_p and VCO_n. In another embodiment, the bias circuits 542, 544 are current mirrors that generate the respective bias voltages. Still other types of bias circuitry may be used. When the bias voltages are properly set, the conducting time of the N-mixer and P-mixer cores 310, 320 can be controlled to maintain balance between the mixer cores 310, 320. Moreover, AC coupling the VCO clock signals to the mixer cores 310, 320 improves overdrive between the gate and source of the switch transistors, further reducing mixer non-linearity.

Figure 6:
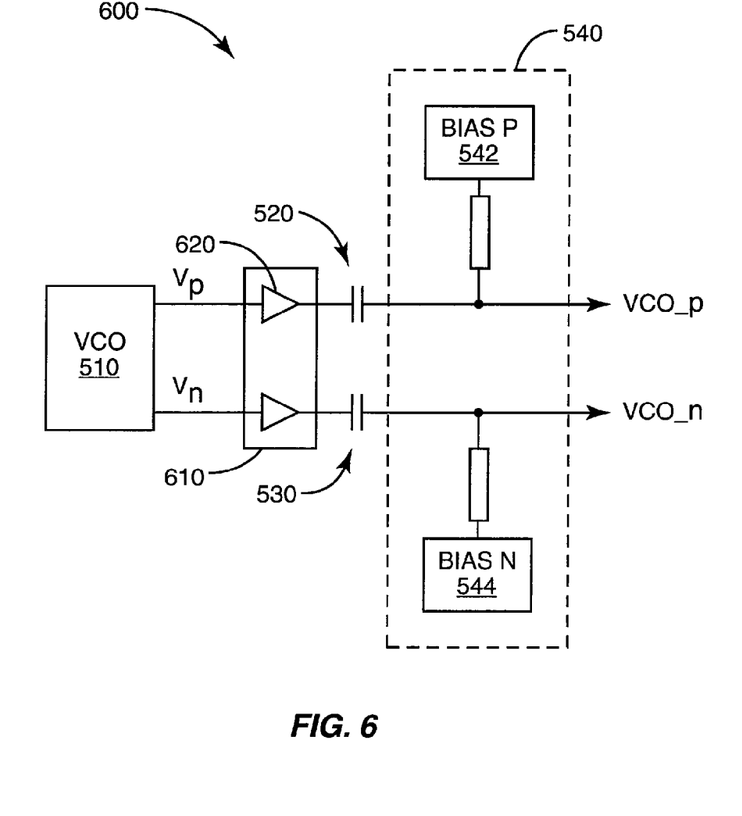
FIG. 6 is a block diagram of an embodiment of an AC clock coupling network including a buffer circuit.

FIG. 6 illustrates another embodiment of an AC coupling network 600. According to this embodiment, the differential VCO clock signals Vp and Vn generated by the VCO component 510 are input to a clock buffer 610. The clock buffer 610 outputs are then AC coupled to the N-mixer and P-mixer cores 310, 320 via the respective capacitors 520, 530. In one embodiment, the clock buffer 610 includes a buffer element 620 inserted between each VCO differential output and the corresponding AC coupling capacitor. The buffer elements 620 provide further isolation between the VCO component 510 and the complimentary mixer 300, reducing self-mixing which is problematic for the receiver 120.

Figure 7:
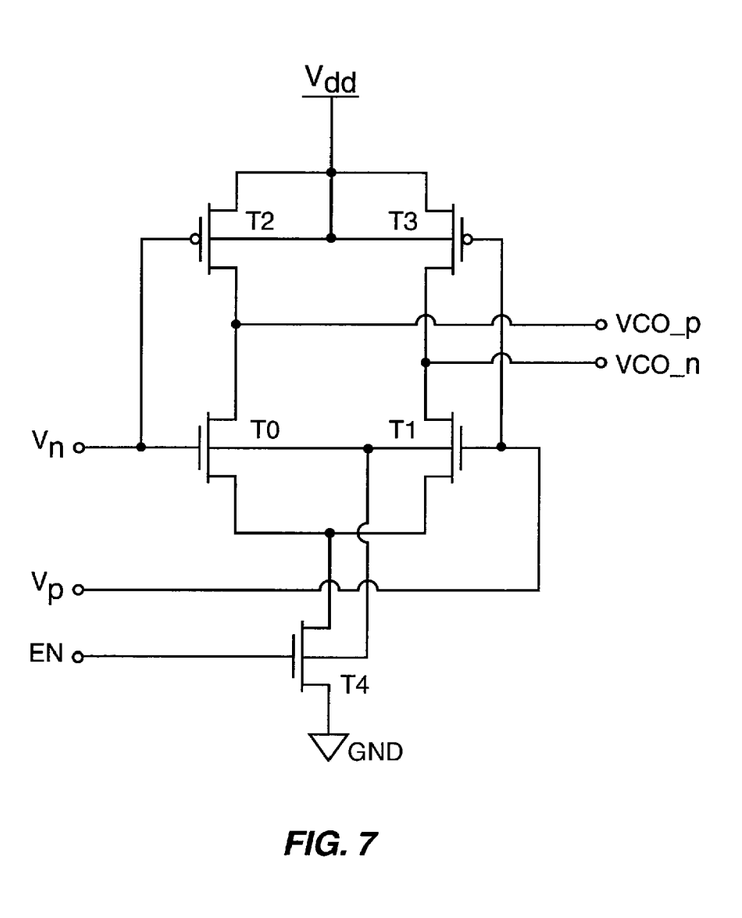
FIG. 7 is a block diagram of an embodiment of a buffer element included in the buffer circuit of FIG. 6.

FIG. 7 illustrates one embodiment of the buffer elements 620. According to this embodiment, each buffer element 620 comprises an inverter pair (T0, T1, T2 and T3) with a tail transistor (T4). The differential VCO clock signals Vp and Vn generated by the VCO component 510 are input to the inverter pair (T0, T1, T2 and T3). The inverter pair (T0, T1, T2 and T3) boosts the VCO signals Vp and Vn at the inverter output (VCO_p, VOC_n) when enabled. The tail transistor T4 is actuated by an enable signal (EN) which controls whether the buffer element 620 is active.

Figure 8:
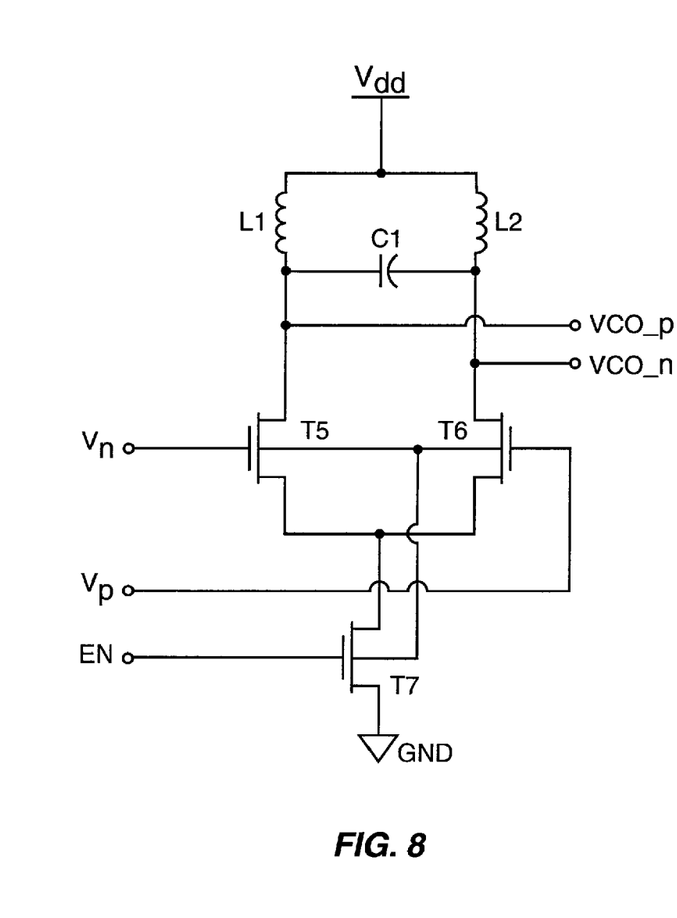
FIG. 8 is a block diagram of another embodiment of a buffer element included in the buffer circuit of FIG. 6.

FIG. 8 illustrates another embodiment of the buffer elements 620. According to this embodiment, a differential pair (T5, T6) has an inductive load (L1, L2). A tail transistor (T7) is actuated by the enable signal (EN) which controls whether the buffer element 620 is active. A tank resonator can be formed by coupling capacitor C1 (and parasitic capacitance) to the inductors L1 and L2 as shown in FIG. 8. The values of L1, L2 and C1 can be selected so that the tank resonates at the VCO frequency. This enables the tank to recover mixer energy at the VCO frequency, reducing the amount of power consumed by the differential pair (T5, T6).

Driving the N-mixer and P-mixer cores 310, 320 either directly by the VCO 510 as shown in FIG. 5 (including via AC coupling) or via the clock buffer 610 as shown in FIG. 6 increases the amplitude of the VCO clock signals, improving mixer linearity. The gate-source over-drive capacity of the LO clock signals can be similarly increased by AC coupling the LO clock signals to the passive mixer output switch transistors TN1-TN4 and TP1-TP4. Accordingly, any of the embodiments described above with respect to the VCO clock signals and illustrated in FIGS. 5-8 can be applied to the LO clock signals. That is, the LO portion (not shown) of the clock circuitry 170 can be similarly coupled to the N-mixer and P-mixer cores 310, 320 using any of the AC coupling embodiments previously described herein. Moreover, the LO clock signals can be biased using any of the biasing embodiments previously described herein.

Figure 9:
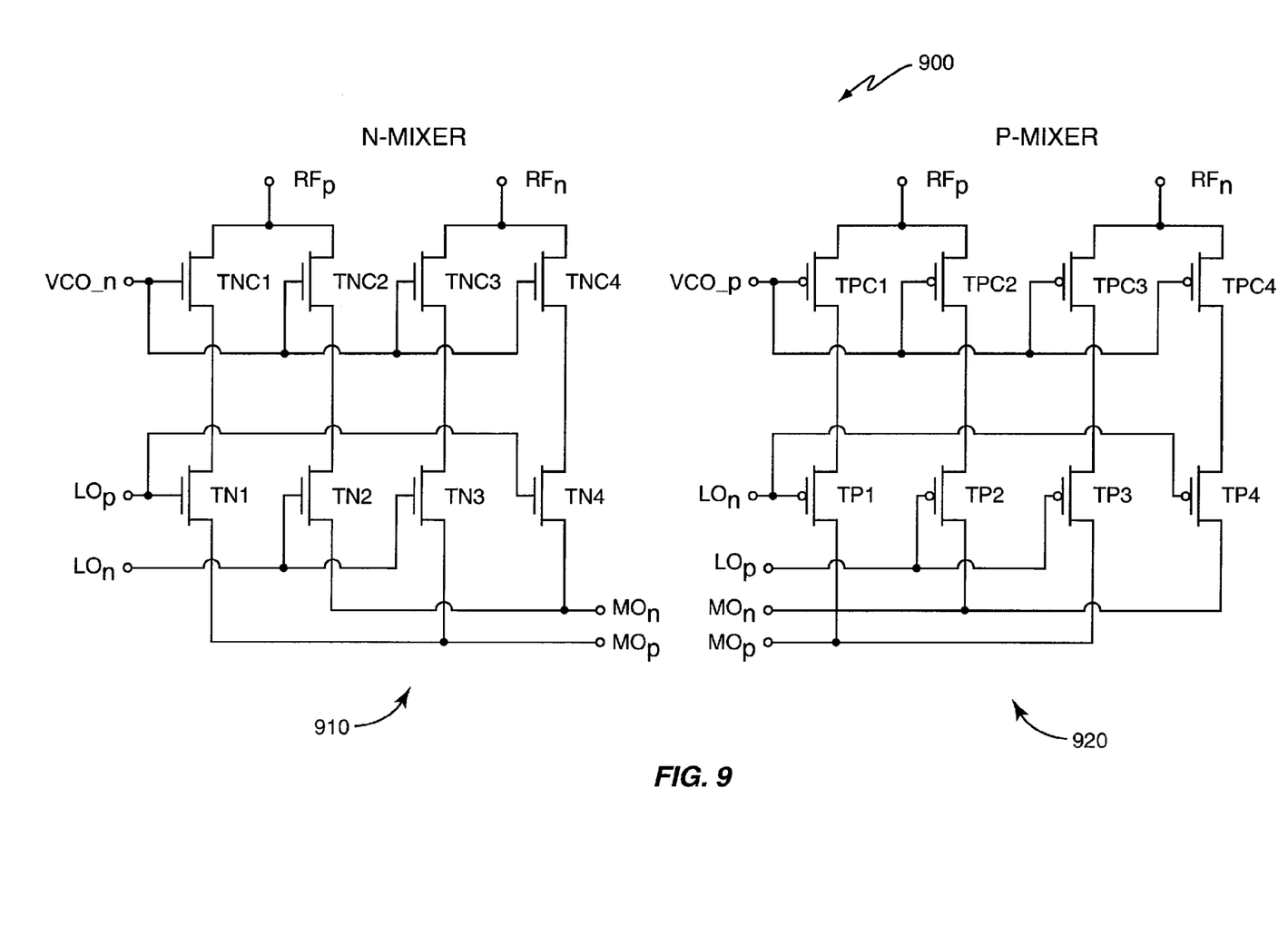
FIG. 9 is a block diagram of another embodiment of passive mixer cores included in the quadrature mixer circuit of FIG. 1.

FIG. 9 illustrates another embodiment of a complimentary passive mixer 900. The complimentary passive mixer 900 includes an N-mixer core 910 having NMOS transistors and a P-mixer core 920 having PMOS transistors as the switch transistors. The N-mixer core 910 or the P-mixer core 920 alone can form either the in-phase or quadrature-phase mixer of a quadrature mixer. Both mixer cores 910, 920 have a plurality of mixer branches, each mixer branch including an input switch transistor connected to an output switch transistor. In one embodiment, the N-mixer core 910 has four output switch transistors including NMOS transistors TN1-TN4. The P-mixer core 920 similarly has four output switch transistors including PMOS transistors TP1-TP4. According to the embodiment illustrated in FIG. 9, each N-mixer output switch transistor TN1-TN4 is connected to a different NMOS input switch transistor TNC1-TNC4, respectively. The P-mixer output switch transistors TP1-TP4 are similarly connected to respective PMOS input switch transistors TPC1-TPC4.

The mixer output switches TN1-TN4 and TP1-TP4 are controlled by the same group of LO clock signals (LOp and LOn) instead of different LO clock signal groups as illustrated in FIG. 3. However, the mixer input switches TNC1-TNC4 and TPC1-TPC4 are controlled by different VCO clock signals. Particularly, the N-mixer input switch transistors TNC1-TNC4 are controlled by a negative VCO clock signal (VCO_n) and the P-mixer input switch transistors TPC1-TPC4 are controlled by a positive VCO clock signal (VCO_p).

Figure 10:
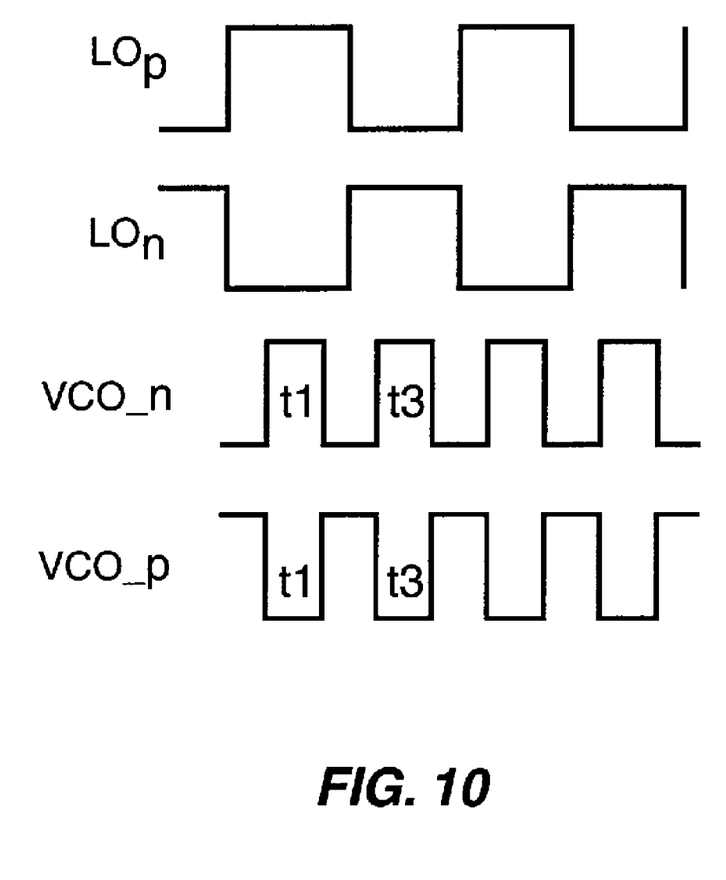
FIG. 10 is a timing diagram of a four-phase clocking scheme applied to the passive mixer cores of FIG. 9.

The N-mixer core 910 has conducting time slots as shown in FIG. 10 in response to the LO clock signals LOp and LOn and the negative VCO clock signal VCO_n. Only two branches of the N-mixer core 910 conduct during each time slot. For example, when clocks VCO_n and LOp are at logic high level during time slot t1, the branches comprising switch transistors TN1/TNC1 and TN4/TNC4 conduct. Operation of the P-mixer core 920 is similarly controlled by the same group of LO clock signals LOp and LOn and the positive VCO clock signal VCO_p also as shown in FIG. 10. For example, when both clocks VCO_p and LOn are at logic low level during time slot t1, the branches comprising switch transistors TP1/TPC1 and TP4/TPC4 conduct. Another conducting slot t3 for both mixer cores 910, 920 occurs a half clock period later during the clock period when clock signals VCO_n and LOn are at a logic high level for the N-mixer 910 and clock signals VCO_p and LOp are at a logic low level for the P-mixer 920. Each conducting time slot is determined by the conducting duty cycle of VCO clock signal, while the LO clock signals select the conducting time slot.

With the above range of variations and applications in mind, it should be understood that the present invention is not limited by the foregoing description, nor is it limited by the accompanying drawings. Instead, the present invention is limited only by the following claims, and their legal equivalents.

What is claimed is:

1. A radio frequency receiver, comprising:
a down-conversion quadrature mixer configured to down-convert radio frequency signals to baseband signals or intermediate frequency signals, the quadrature mixer comprising an in-phase passive mixer and a quadrature-phase passive mixer, wherein each of the passive mixers comprises at least one mixer core having a plurality of mixer input switch transistors and a plurality of output switch transistors connected to the mixer input switch transistors;
clock circuitry configured to generate a first set of clock signals and a second set of clock signals, the first set of clock signals having a frequency twice that of the second set of clock signals; and
wherein the first set of clock signals are arranged to drive the mixer input switch transistors and the second set of clock signals are arranged to drive the output switch transistors.

2. The radio frequency receiver of claim 1, wherein the first and second sets of clock signals comprise pulse clock signals or sinusoidal clock signals.

3. The radio frequency receiver of claim 1, wherein the first set of clock signals has a duty cycle of approximately 50%.

4. The radio frequency receiver of claim 1, wherein the second set of clock signals has a duty cycle of approximately 25% to 50%.

5. The radio frequency receiver of claim 1, wherein the at least one mixer core comprises two input switch transistors and four output switch transistors, each of the input switch transistors being connected to two of the output switch transistors.

6. The radio frequency receiver of claim 1, wherein the at least one mixer core comprises four input switch transistors and four output switch transistors, each of the input switch transistors being connected to a different one of the output switch transistors.

7. The radio frequency receiver of claim 1, wherein each of the passive mixers comprises an N-mixer having NMOS transistors, a P-mixer having PMOS transistors or a complementary mixer having an N-mixer and a P-mixer.

8. The radio frequency receiver of claim 1, further comprising:
one or more capacitors arranged to capacitively couple the first and/or second set of clock signals to the passive mixers; and
bias circuitry configured to adjust a conducting time slot of the passive mixers.

9. The radio frequency receiver of claim 8, further comprising clock buffer circuitry configured to buffer the first and/or second set of clock signals before the clock signals are capacitively coupled to the passive mixers.

10. The radio frequency receiver of claim 9, where the clock buffer circuitry comprises one or more tank resonators.

11. A method of down-converting radio frequency signals to baseband signals or intermediate frequency signals, comprising:
providing an in-phase down-conversion passive mixer and a quadrature-phase down-conversion passive mixer, wherein each of the passive mixers comprises at least one mixer core having a plurality of mixer input switch transistors and a plurality of output switch transistors connected to the mixer input switch transistors;
generating a first set of clock signals and a second set of clock signals, the first set of clock signals having a frequency twice that of the second set of clock signals; and
driving the mixer input switch transistors with the first set of clock signals and the output switch transistors with the second set of clock signals.

12. The method of claim 11, wherein generating the first and second sets of clock signals comprises generating pulse clock signals or sinusoidal clock signals.

13. The method of claim 11, wherein the first set of clock signals has a duty cycle of approximately 50%.

14. The method of claim 11, wherein the second set of clock signals has a duty cycle of approximately 25% to 50%.

15. The method of claim 11, wherein the at least one mixer core comprises two input switch transistors and four output switch transistors, each of the two input switch transistors being connected to two of the output switch transistors and driven by the same clock signal.

16. The method of claim 11, wherein the at least one mixer core comprises four input switch transistors and four output switch transistors, each of the four input switch transistors being connected to a different one of the output switch transistors and driven by the same clock signal.

17. The method of claim 11, wherein the at least one mixer core comprises two output switch transistors driven by a first clock signal and two output switch transistors driven by a second clock signal.

18. The method of claim 11, further comprising:
capacitively coupling the first and/or second set of clock signals to the passive mixers; and
adjusting a conducting time slot of the passive mixers.

19. The method of claim 18, further comprising buffering the first and/or second set of clock signals before the clock signals are capacitively coupled to the passive mixers.

* * * * *

UNITED STATES PATENT AND TRADEMARK OFFICE
CERTIFICATE OF CORRECTION

PATENT NO. : 8,099,070 B2
APPLICATION NO. : 12/108239
DATED : January 17, 2012
INVENTOR(S) : Mu et al.

Page 1 of 1

It is certified that error appears in the above-identified patent and that said Letters Patent is hereby corrected as shown below:

Title Page, Item (56), under "OTHER PUBLICATIONS", in Column 2,
Line 3, delete "pdfserv.maxim-ic.com/en/an1AN749.pdf." and
insert -- pdfserv.maxim-ic.com/en/an/AN749.pdf. --, therefor.

Signed and Sealed this
Twenty-fourth Day of July, 2012

David J. Kappos
*Director of the United States Patent and Trademark Office*